United States Patent [19]

Ault

[11] Patent Number: 4,613,861
[45] Date of Patent: Sep. 23, 1986

[54] PROCESSING SYSTEM HAVING DISTRIBUTED RADIATED EMISSIONS

[75] Inventor: Cyrus F. Ault, Wheaton, Ill.

[73] Assignee: AT&T Bell Laboratories, Murray Hill, N.J.

[21] Appl. No.: 753,817

[22] Filed: Jul. 9, 1985

Related U.S. Application Data

[63] Continuation of Ser. No. 610,095, May 14, 1984, abandoned.

[51] Int. Cl.<sup>4</sup> ............................................. G08C 19/00
[52] U.S. Cl. ................................. 340/825.73; 331/69; 370/85; 340/825.52
[58] Field of Search .................... 340/310 CP, 825.28, 340/825.29, 825.73, 825.52, 825.53, 870.16, 870.17; 331/46, 48, 49, 56, 69, 70, 107; 370/85, 89, 92, 95, 123; 361/392, 393, 394; 84/1.17, 1.01, DIG. 20, DIG. 22; 377/25; 219/210; 179/18 ES; 364/200

[56] References Cited

U.S. PATENT DOCUMENTS

| | | | |
|---|---|---|---|
| 2,951,128 | 8/1960 | Kingsbury | 179/175.31 |
| 2,997,908 | 8/1961 | Hilborn | 84/1.01 |
| 3,070,754 | 12/1962 | Wu | 331/49 |
| 3,300,623 | 6/1967 | Smyrnos | 219/210 X |
| 3,341,742 | 9/1967 | Klehm | 361/394 X |
| 3,490,327 | 1/1970 | Volpe | 331/48 X |
| 3,560,628 | 2/1971 | Plunkett et al. | 84/1.01 X |
| 3,588,365 | 6/1971 | McNeilly et al. | 179/81 R X |
| 3,812,297 | 5/1974 | Borbas | 179/ES |
| 3,948,137 | 4/1976 | Niinomi | 84/DIG. 20 X |
| 3,986,423 | 10/1976 | Rossum | 84/1.01 |
| 3,992,686 | 11/1976 | Canning | 361/413 X |
| 4,041,825 | 8/1977 | Pascetta | 84/1.01 |
| 4,181,899 | 1/1980 | Liu | 331/94.5 C |
| 4,216,371 | 8/1980 | Marotel | 219/210 X |
| 4,373,415 | 2/1984 | Kondo | 84/DIG. 20 X |

FOREIGN PATENT DOCUMENTS 0086137 8/1983 European Pat. Off. .

Primary Examiner—Ulysses Weldon
Attorney, Agent, or Firm—D. Volejnicek

[57] ABSTRACT

A processing system (10) includes a backplane bus (13) that defines a plurality of locations (20-31) implemented as backplane slots each for connecting any option module (41) thereto. Each slot includes contact pins (201a-d) that carry binary logic levels forming a different digital number at each slot. Option modules include their own source of timing signals (220) comprising an oscillator (221) and an identical thermally-sensitive crystal (222) for driving the oscillator. Each option module includes receptacles (207a-d) for the contact pins. The receptacles are connected to the digital input port of a D/A converter (225) whose output port is connected to a heater (224) mounted in physical proximity to the crystal in the crystal's case (223). Depending on which slot an option module is mounted in, the D/A converter receives a different digital input and hence generates a different level of output. The heater generates heat in proportion to the converter's output and hence raises the temperature of the crystal to a different level at each slot, causing the crystal to generate somewhat different fundamental frequency at each slot. Hence option modules connected to different slots generate different fundamental frequencies and therefore emit different harmonic frequencies. Hence the amplitudes of the harmonics emitted by different option modules are non-additive, and radiated emission levels of the processing system equipped with all option modules are no higher than those of the system equipped with only one option module.

26 Claims, 7 Drawing Figures

PROCESSING SYSTEM HAVING DISTRIBUTED RADIATED EMISSIONS

CROSS-REFERENCE TO RELATED APPLICATION

This application is a continuation of application Ser. No. 610,095, filed May 14, 1984, now abandoned.

TECHNICAL FIELD

This invention relates to processing systems in general, and in particular concerns control of electromagnetic emissions radiated by such systems.

BACKGROUND OF THE INVENTION

A processing system generally comprises a basic processor including a central processing module and a memory module, and a bus to which may be selectively connected one or more other functional modules that serve to enhance or expand the processor's capabilities and adapt the processor to its particular application. Such functional modules for example may include input and output (I/O) modules that interface the processor with equipment that allows it to communicate with the outside world.

To properly time and synchronize operation of its internal circuits, each module commonly includes a source of timing, or clock, signals such as a crystal-driven oscillator. And to make the modules of a system compatible with each other, for example, such as to make them interchangeable, and to make the modules capable of efficiently carrying on communications with each other across the bus, commonly the oscillators—and hence the driving crystals—of all modules of a system are substantially identical and generate signals of the same frequency.

Only the one principal, or fundamental, frequency that is generated by an oscillator is required for the operation of a module. However, because of inherent imperfections in crystals that are used to generate the frequency, and because of nonlinearities of circuit components that are driven by the oscillator output, other frequencies that are integral multiples, or harmonics, of the fundamental frequency are generated within a module as well. The harmonics are undesirable because they are emitted, radiated, by the equipment that has generated them and thus can interfere with operation of other equipment and with communications in the vicinity.

The greater the strength, or amplitude, of the radiated emissions, the greater the possibility of their causing interference, and the greater the distance at which they can cause interference. Hence it is desirable to keep the level of the radiated emissions to a minimum, and governmental agencies such as the Federal Communications Commission set strict limits on the levels of emissions that are allowed for various kinds of equipment, including processing systems.

Various schemes exist for limiting the radiated emissions of equipment, such as electromagnetic shielding of the emitting equipment. However, no effective scheme exists for eliminating the emissions completely. This presents a problem especially in systems having a plurality of identical frequency sources, such as the above-described processing systems, because the amplitudes of the plurality of emissions are additive at any one frequency. In spite of attempts to limit emissions by electromagnetic shielding, it may be difficult or impossible to meet limits imposed on emission levels with equipment having a plurality of like frequency sources. Hence the above-described processing systems may either be restricted in use to environments to which relatively high emission limits are applicable. Or such systems may be restricted in their processing power, versatility, and capabilities because they cannot be equipped with more than a limited number of functional modules in order to meet applicable emission level limits.

SUMMARY OF THE INVENTION

It is these and other disadvantages and problems of the prior art that the invention is directed to solving. Broadly according to the invention, apparatus that has a plurality of connecting arrangements, each for connecting to a frequency-generating apparatus, also has an arrangement for identifying the connecting arrangements, while the frequency-generating apparatus has an arrangement that is responsive to the connecting-arrangement-identifying arrangement and generates a frequency which is dependent upon the identity of the connecting arrangement to which the frequency-generating apparatus is connected. More specifically, a processing system that has a communication bus defining locations each for connecting to a circuit package, such as a functional module, also has an arrangement for identifying each location, while the circuit package includes a frequency-generating arrangement, such as a crystal-driven oscillator, that is responsive to the location-identifying arrangement and generates a frequency that is a function of the identity of the location to which the circuit package is connected.

Advantageously, a functional module of a processing system according to this invention generates a somewhat different fundamental frequency at each location of the bus, and hence modules connected to different locations generate somewhat different fundamental frequencies from each other even though all of the connected modules may have identical frequency-generating arrangements. Since the fundamental frequencies of the connected modules are different, their harmonics are also different, and hence the levels of the harmonics are not additive. Therefore, the amplitude of radiated emissions of a processing system equipped with a single module is no greater than that of the system equipped with a plurality of modules. Yet this result is accomplished while the crystals of all modules of the processing system are allowed to remain identical, as the invention does not rely on differences among the modules and their crystals. Indeed, identical modules may be connected to different locations on the bus without affecting the level of the system's radiated emissions. And in processing systems wherein modules are interchangeable, in that any module may be connected to any location on the bus, the interchangeability of the modules is preserved, because the invention does not depend upon the positioning of modules. These and other advantages and features of the present invention will become apparent from the following description of an illustrative embodiment of the invention, taken together with the drawing.

DETAILED DESCRIPTION

Figure 1:
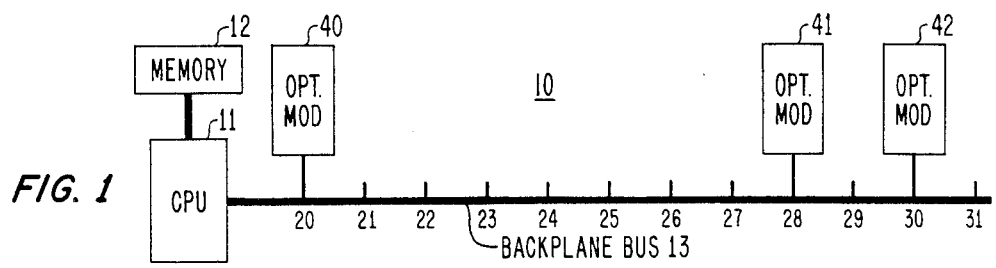
FIG. 1 is a block diagram of a processing system embodying an illustrative example of the invention.

Shown in FIG. 1 is an example of a processing system 10 that includes an illustrative embodiment of the invention. The processing system 10 may be, for example, the AT&T 3B2 computer of AT&T Technologies, Inc. The processing system 10 includes a basic processor that comprises a central processing unit (CPU) 11 and a memory 12 connected to the central processing unit 11. Also connected to the CPU 11 is a backplane bus 13. The bus 13 defines a plurality—in this case twelve—locations numbered 20 through 31, at which option modules may be connected to the bus 13. The connecting arrangement allows the processing system 10 to be equipped with up to twelve option modules. The system 10 may be equipped with fewer than twelve option modules, or no option modules. Three option modules 40 through 42 are illustratively shown connected to the bus 13 at locations 20, 28, and 30, respectively.

The bus 13 may define other locations as well. For example, the CPU 11 and the memory 12 may occupy a pair of locations on the bus 13. The bus 13 provides a communication path between the CPU 11 and the various option modules that may be connected to the bus 13.

The option modules are circuit packages that provide various capabilities, such as I/O capabilities, to the processing system 10. For purposes of lower system cost, versatility, ease of manufacture, etc., the option modules are substantially identical, and any option module may be connected to the bus 13 at any location 20-31.

Figure 2:
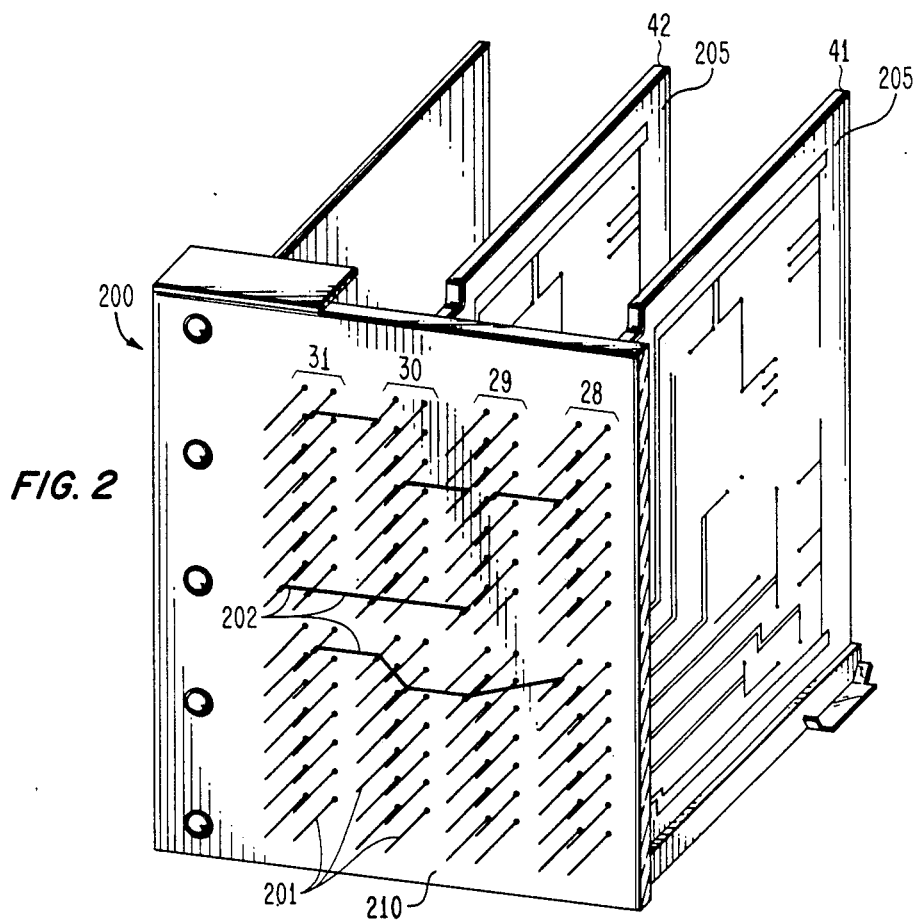
FIG. 2 is a perspective view of the implementation of the backplane bus, with option modules, of FIG. 1.

FIG. 2 illustrates the physical structure of the bus 13 and the option modules. As its name implies, the backplane bus 13 is implemented in a backplane 200. The backplane 200 comprises a circuit board 210 through which extend a plurality of half-connectors such as contact pins 201. The pins 201 are arranged in a plurality of groups to define a plurality of backplane slots. Each slot represents one of the locations 20-31 for connecting an option module to the bus 13. The portion of the backplane 200 shown in FIG. 2 represents locations 28-31.

The option modules, of which the modules 41 and 42 are shown in FIG. 2, are circuit packages formed of printed circuit boards 205 that support various circuits, including frequency-generating arrangements, and printed conductors that interconnect the circuits. An edge of each circuit board 205 is adapted to electrically contact and engage the contact pins 201 of any location 20-31, thereby to make electrical contact between the conductors of the board 205 and the pins 201 of the location and also to mount the board 205 on the board 210. Any option module may be connected to the bus 13 at any location 20-31.

The bus 13 is formed by the pins 201 and by conductors 202, such as conductors printed on the backplane circuit board 210 or wires extending along the board 210, that connect to various of the pins 201. The conductors 202 implement various functional lines of the bus 13, such as signal and power lines. Included among the functional lines of the bus 13 are a ground (GND) line and a positive voltage source (V+) line, shown in FIG. 3. Signal levels carried by these two lines represent the binary logic zero and one signal levels, respectively. The GND and V+ lines are connected to certain ones of the pins 201 in a manner that defines a unique identification code for each of the locations 20-31. In this manner, each of the locations 20-31 is uniquely identified. This location-identifying arrangement is illustrated in FIG. 3.

Figure 3:
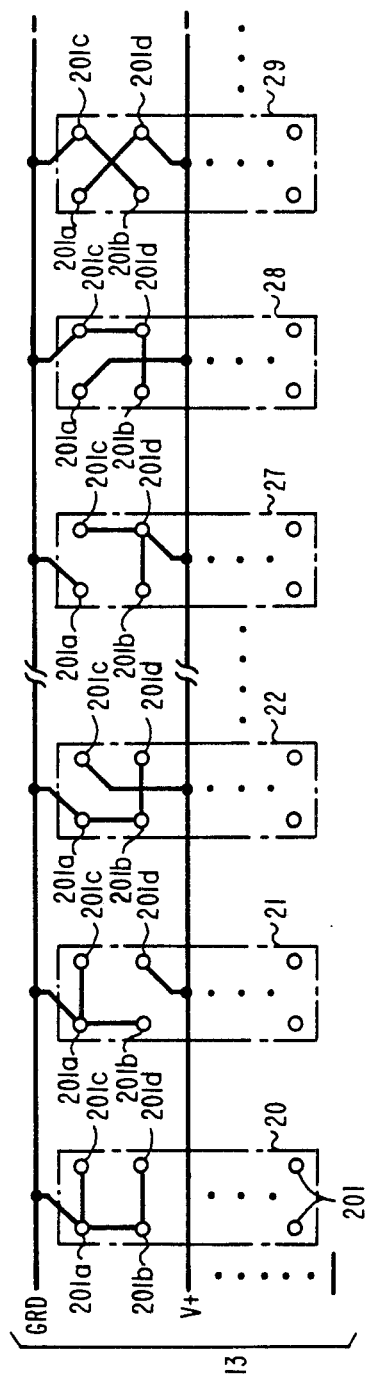
FIG. 3 is a circuit diagram of the connection of certain lines of the backplane bus of FIGS. 1 and 2.

As FIG. 3 shows, the pins 201 that define the identity of each location 20-31 include four pins 201a-d to which are connected the GND and V+ lines. The arrangement in which the GND and V+ lines and the pins 201a-d are connected is different at each location 20-31. For example, at the location 20 the GND line is connected to all four pins 201a-d while the V+ line is not connected to any of the pins 201a-d. Because the GND line represents the logical zero level, the location 20 is marked by pins 201a-d with the digital identification code "0000". At the location 21 the GND line is connected to the pins 201a-c while the V+ line is connected to the pin 201d. The location 21 is thus marked with the digital identification code "0001". At the location 22 the GND line is connected to the pins 201a, b, and d, and the V+ line is connected to the pin 201c, thereby identifying the location 22 as "0010". The pins 201a-d of the other locations 23-31 are similarly connected to the lines GND and V+ to mark the locations with the digital identification codes "0011" through "1011", respectively. Thus each location 20-31 is identified by a different digital identification code.

Returning to a consideration of the option modules, while the circuitry of different modules may support or implement different functions, the option modules have certain features in common. The common features that are relevant to an appreciation of this invention are shown and described in FIG. 4 which shows the option module 41. The module 41 is representative of all option modules. As was mentioned before, any option module may be connected to the bus 13 at any location 20-31. For this purpose, the circuit board 205 of the option module 41 supports at one edge thereof an edge connector 206 which is adapted to engage and make electrical contact with the contact pins 201 of any location 20-31. The edge connector 206 comprises a plurality of half-connectors, which in this example are contact receptacles 207, each of which is adapted to mate with a corresponding pin 201 of any location 20-31. The connector 206 includes receptacles 207a-d which are configured to mate with the pins 201a-d.

Like all option modules, the module 41 includes a frequency-generating circuit 220, for generating timing signals for controlling the operation of the various other circuits of the option module 41. The frequency-generating circuit 220 includes a conventional oscillator 221 which is driven in a conventional manner by a crystal 222. All option modules are designed to operate with timing signals having the same nominal frequency and to operate in a range of frequencies around the selected nominal frequency. Hence all option modules have substantially identical crystals 222 that output the same nominal frequency. For purposes of this illustrative example the nominal frequency output of the crystal 222 is about 8 MHz, but the various circuits of the option modules are designed to operate in a range of frequencies ranging from about 7.5 MHz to about 10.5 MHz.

The frequency-generating circuit 220 includes an arrangement for varying the frequency of oscillation of the oscillator 221 by varying the frequency generated by the crystal 222. The crystal 222 is housed in a protective case 223. Included in the case 223 in physical proximity to the crystal 222 is a heater 224, such as a diode. The physical proximity of the crystal 222 and the heater 224 and their encapsulation in the common case 223 ensure that the crystal 222 is thermally coupled with the heater 224. The heater 224 is connected to the output port of a conventional digital-to-analog (D/A) converter 225. The digital input port of the D/A converter 225 is connected to the receptacles 207a–d. The output of the D/A converter 225 powers the heater 224. The output of the D/A converter 225 is a function of the binary signal values that it receives at its digital input port from the pins 201a–d via the receptacles 207a–d. The D/A converter 225 converts the digital signal input into a proportional current level output.

Figures 4, 5:
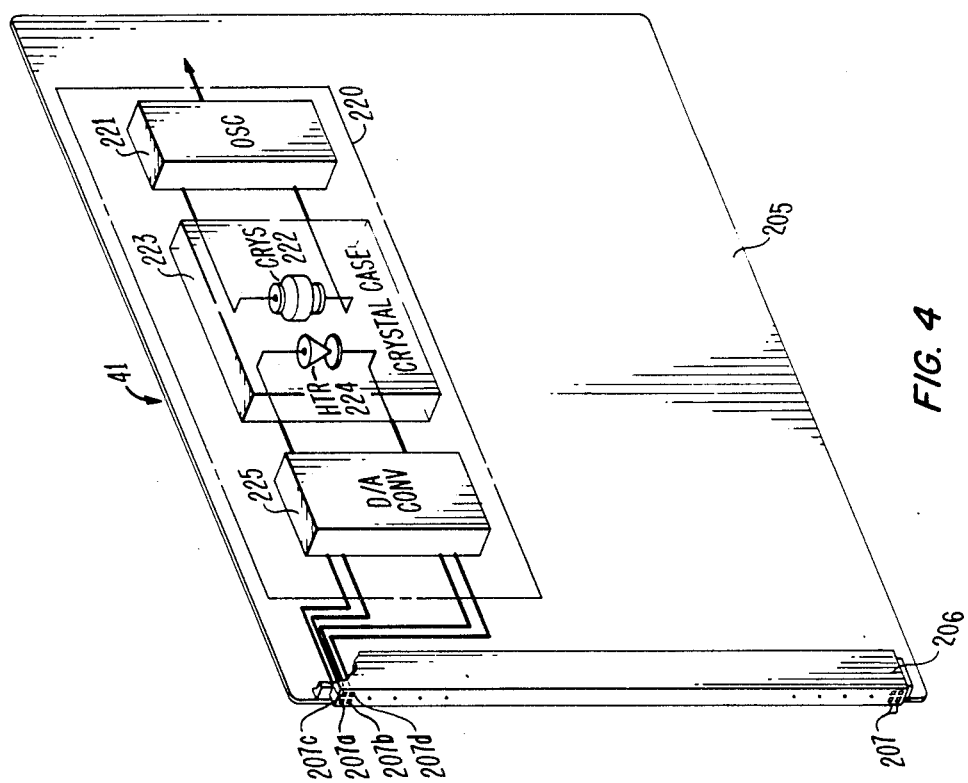
FIG. 4 is a diagram of a frequency signal source circuit of an option module of FIGS. 1 and 2.
FIG. 5 is a table showing the operating characteristics of the digital-to-analog converter of the option module of FIG. 4.

FIG. 5 illustrates in tabular form the operating characteristic of the D/A converter 225. FIG. 5 shows that the D/A converter generates a different level of output for every different digital input. For example, when the option module 41 is connected to the location 20, the D/A converter 225 receives at its digital inputs the digital value "0000". The D/A converter 255 responds to that input by generating no output. When the option module 41 is connected to the location 21, the D/A converter 225 receives the digital value "0001" and responds thereto by generating a current output level having a value of X. At location 22 the D/A converter 225 receives the value "0010" and in response generates an output level of 2X. At location 23 the D/A converter 225 generates an output level of 3X, and so on, until at location 31 the D/A converter 225 generates an output level of 11X. Since the digital input of the D/A converter 225 is the digital identification code of the location 20–31 to which the module 41 is connected, the output of the D/A converter is a function of the identity of the connected location 20–31.

The output of the D/A converter 225 provides energy for powering the heater 224. The more current the converter 225 provides to the heater 224, the more heat the heater 224 generates and hence the more it raises the temperature of the crystal 222. Therefore, because the digital input to the D/A converter 225 is different at each location 20–31, the temperature of the crystal 222 is different at each location 20–31 and is dependent upon the location 20–31 to which the option module 41 is connected. The D/A converter 225 is selected such that the difference X in its output level per unit change in its digital input causes the heater 224 to produce a temperature change $\Delta t$ in the crystal 222. Hence the temperature of the crystal 222 is a function of the identity of the connected location 20–31.

Figure 6:
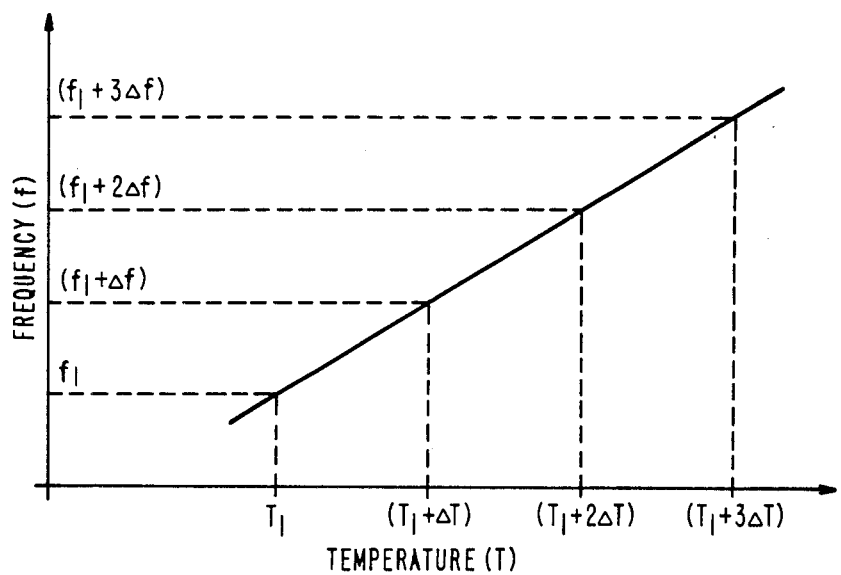
FIG. 6 is a graph of the thermal characteristic of the crystal of the option module of FIG. 4.

Turning to FIG. 6, there is shown in graph form the thermal characteristic of the crystal 222. The crystal 222 has a high thermal coefficient. The crystal 222 is therefore thermally responsive, in that its frequency output f changes significantly for a given change $\Delta t$ in temperature. The thermal characteristic of the crystal 222 is rather linear, in that equal-size changes $\Delta t$ in temperature of the crystal 222 produce approximately equal-size changes $\Delta f$ in the frequency output of the crystal 222. The crystal 222 is selected to produce a nominal frequency $f_1$ at ambient operating temperature $T_1$. The ambient operating temperature $T_1$ is the temperature in the case 223 with the heater 224 not powered. The nominal frequency $f_1$ in this illustrative example is about 8 MHz. This is the fundamental frequency generated by the crystal 222 when the option module 41 is connected to the location 20. The harmonics generated by the option module 41 in the location 20 are therefore integral multiples of $f_1$. At location 21, the D/A converter 225 generates an output level of X, causing the heater 224 to raise the temperature of the crystal 222 by $\Delta t$ over the ambient temperature $T_1$. The crystal 222 responds to the temperature increase of $\Delta t$ by increasing the fundamental frequency that it generates by $\Delta f$ over the nominal frequency of $f_1$. In location 21 the module 41 therefore generates harmonics that are integral multiples of $(f_1 + \Delta f)$. In this illustrative example, $\Delta f$ may be, for example, 200 KHz.

At location 22, the temperature of the crystal 222 is $(T_1 + 2\Delta t)$, the fundamental frequency generated by the crystal 222 is $(f_1 + 2\Delta f)$, and hence the harmonics generated by the option module 41 are integral multiples of $(f_1 + 2\Delta f)$. The temperature and frequencies increase correspondingly at the other locations 23–31 of the bus 13. Hence the fundamental and harmonic frequencies generated by the crystal 222 are a function of the identity of the connected location 20–31.

Ambient temperature changes will also cause shifts in the frequency output of the crystals. However, changes in the ambient temperature will generally be common to all modules and hence will affect the crystals of all boards substantially equally. Hence the frequency outputs of all modules' crystals will tend to drift in unison and maintain their relative frequency differences.

Figure 7:
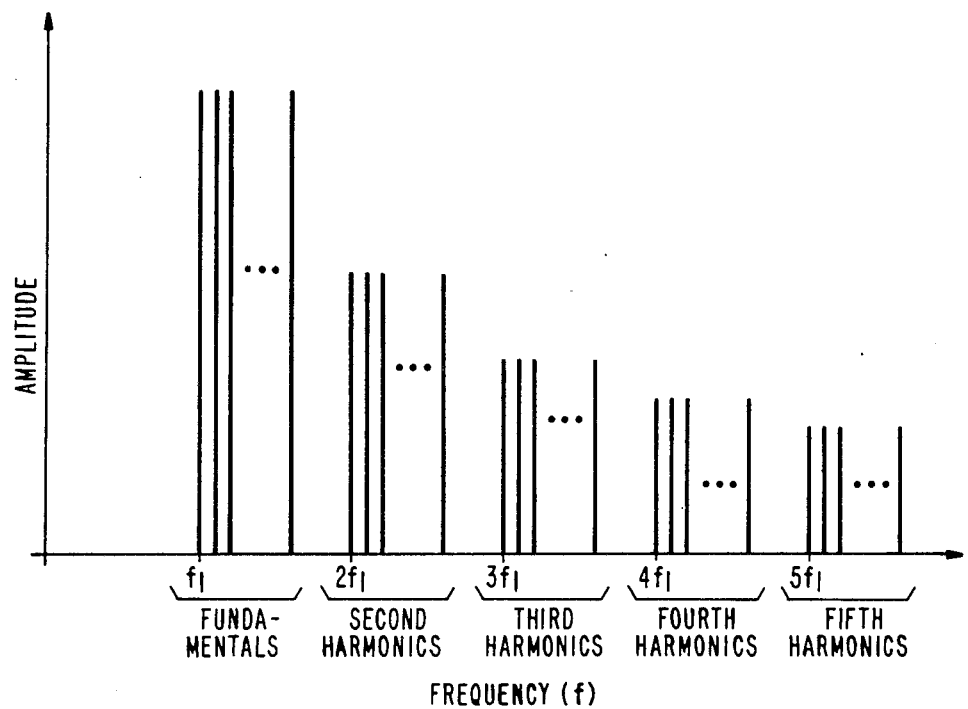
FIG. 7 is an illustrative graph of the distributed radiated emissions of the processing system of FIG. 1.

FIG. 7 shows the net result of this invention as applied in the above-described illustrative embodiment of the processing system 10. As a result of each option module with which the processing system 10 is equipped operating at a slightly different fundamental frequency, the harmonics emitted by these modules likewise fall at slightly different frequencies. And because harmonics of different modules are not of the same frequencies, the amplitudes of the harmonics are not additive. Therefore the harmonics of different modules do not reinforce each other, and hence the peak harmonic signals produced by the processing system 10 equipped with all option modules are substantially no higher than those produced by the processing system 10 equipped with only one option module. Yet the various option modules still retain their common characteristics, such as being driven by substantially identical crystals, and the system still retains its versatility of accepting connection of any option module at any of the locations 20–31.

Of course, various changes and modifications to the illustrative embodiment described above will be apparent to those skilled in the art. For example, each option module may have an assigned location on the backplane bus, depending upon the modules' function. The system may be capable of accepting fewer than or more than twelve option modules. The modules may operate at a different nominal frequency or with different frequency changes among the bus locations than the ones disclosed. The disclosed linear D/A converter and diode may be replaced by a D/A converter that generates a current level output proportional to the square root of the digital signal input and by a resistor, respectively.

Or the D/A converter and heater may be replaced by a resistive network that may be powered directly from the V+ signal line. Such changes and modifications can be made without departing from the spirit and the scope of the invention and without diminishing its attendant advantages. It is therefore intended that such changes and modifications be covered by the following claims.

What is claimed is:

1. A computer circuit package for reducing additive emissions of signals of the same frequency radiated from a plurality of circuit packages including said computer circuit package each capable of having virtually identical frequency generating means for producing output signals of said same frequency in a computer having at least one central processing unit, and a bus connected to the central processing unit and defining a plurality of locations each for connecting to one of said circuit packages to provide a communication path between the central processing unit and the circuit package, each said location having an arrangement for uniquely identifying said last-mentioned location, said computer circuit package comprising:

generating means being cooperative with the location-identifying arrangement for generating clocking signals to control timing and synchronizing of operation of the computer circuit package in the computer and the clocking signals having a frequency that is dependent upon the identity defined by the location-identifying arrangement of the location defined by the bus connected to the central processing unit to which the computer circuit package is connected to generate clocking signals having a first frequency and harmonics of the first frequency when the package is connected to one location that are different from clocking signals having a second frequency and harmonics of the second frequency that it generates when connected to a second location, whereby harmonics generated by a plurality of the computer circuit packages each connected to a different one of a plurality of the locations are different from each other and hence are non-additive, to limit radiated emission levels.

2. The computer circuit package of claim 1 wherein the generating means comprise:
an oscillator; and
means for varying the oscillation frequency of the oscillator as a function of the identity of the location to which the circuit package is connected.

3. The computer circuit package of claim 1 for use in a computer having a location-identifying arrangement that identifies each location fixedly and uniquely, wherein the generating means comprise:
generating means being cooperative with the location-identifying arrangement for generating clocking signals having a frequency that is a unique and fixed function of the identity of the location to which the computer circuit package is connected and that is independent of and unaffected by both connection to and disconnection from the bus locations of any other one or more computer circuit packages.

4. The circuit package of claim 1 wherein said computer is a processing system, and wherein
said generating means comprise:
a thermally-responsive crystal for generating a frequency that is a function of its temperature; and
means responsive to said location-identifying arrangement for changing the temperature of said crystal as a function of the identity of the location to which said circuit package is connected.

5. A circuit package for reducing additive emissions of signals of the same frequency radiated from a plurality of circuit packages each capable of having virtually identical frequency generating means for producing output signals of the same frequency, and for use with a processing system having a bus defining a plurality of locations each for connecting to a circuit package and an arrangement for identifying each location, comprising:
a thermally-responsive crystal for generating a frequency that is a function of its temperature; and
means responsive to the location-identifying arrangement for changing the temperature of the crystal as a function of the identity of the location to which the circuit package is connected.

6. A circuit package for reducing additive emissions of signals of the same frequency radiated from a plurality of circuit packages each capable of having virtually identical frequency generating means for producing output signals of the same frequency, and for use with a processing system having a bus defining a plurality of locations each for connecting to a circuit package and an arrangement for identifying each location, comprising:
a thermally-responsive crystal for generating a frequency that is a function of its temperature;
heating means thermally coupled to the crystal; and
means responsive to the location-identifying arrangement for supplying to the heating means power as a function of the identity of the location to which the circuit package is connected.

7. A circuit package, for use with a processing system having a bus defining a plurality of locations each for connecting to a circuit package and an arrangement for identifying each location, comprising:
an oscillator;
a thermally-responsive crystal for generating a frequency that is a function of its temperature, for driving the oscillator;
heating means in physical proximity to the crystal;
a casing encapsulating the crystal and the heating means; and
a digital-to-analog converter having an output port connected to the heating means and having an input port for connection to the location-identifying arrangement of the location to which the circuit package is connected, for supplying to the heating means power as a function of the identity of the location to which the circuit package is connected.

8. A circuit package, for use with a processing system having a bus defining a plurality of locations, each for connecting to a circuit package and including a plurality of contacts each carrying a binary signal for uniquely identifying the location, comprising:
an oscillator;
a thermally-responsive crystal driving the oscillator;
heating means thermally coupled to the crystal; and
a digital-to-analog converter having an output port connected to the heating means and having an input port for connection to the plurality of contacts of any location to which the circuit package is connected.

9. A computer for reducing additive emissions of signals of the same frequency radiated from a plurality of circuit packages each capable of having virtually identical frequency generating means for producing output signals of said same frequency, the computer comprising:

at least one central processing unit;

a communication bus connected to the central processing unit and defining a plurality of locations each for connecting to one of said plurality of circuit packages to provide a communication path between the central processing unit and the circuit package;

each said location having means for uniquely identifying said last-mentioned location; and at least one of the said plurality of circuit packages being connected to a different individual one of said locations and the circuit package including generating means being cooperative with the location-identifying means for generating clocking signals to control timing and synchronizing of operation of the circuit package and the clocking signals having a frequency that is dependent upon the identity of the location to which the circuit package is connected to generate clocking signals having a first frequency and harmonics of the first frequency when the package is connected to said one of said locations that are different from clocking signals having a second frequency and harmonics of the second frequency that either this or another one of the circuit packages generates when connected to a second one of said locations, whereby harmonics generated by a plurality of the circuit packages each connected to a different one of a plurality of the bus locations are different from each other and hence are non-additive, to limit radiated emission levels.

10. The computer of claim 9 wherein
the bus comprises a backplane bus, and wherein
each location comprises a backplane slot.

11. The computer of claim 9 wherein each location has associated therewith means for identifying the location.

12. The computer of claim 11 wherein the location-identifying means comprise means for indicating a digital identification code of the location.

13. The computer of claim 11 wherein the location-identifying means comprise at least one contact each carrying one of a plurality of signal levels.

14. The computer of claim 11 wherein the location-identifying means comprise a plurality of half-connectors each carrying a binary signal.

15. The computer of claim 9 wherein
said computer is a processing system, and wherein
said generating means of a circuit package comprise:
a thermally-responsive crystal for generating a frequency that is a function of its temperature; and
means responsive to said location-identifying arrangement for changing the temperature of said crystal as a function of the identity of the location to which said circuit package is connected.

16. The computer of claim 9 wherein
the location-identifying means comprise
means for uniquely and fixedly identifying each location; and wherein
the generating means of each circuit package comprise generating means being cooperative with the location-identifying arrangement for generating clocking signals to control timing and synchronizing of operation of the circuit package and the clocking signals having a frequency that is a unique and fixed function of the identity of the location to which the circuit package is connected and that is independent of and unaffected by both connection to and disconnection from the bus locations of any other one or more circuit packages.

17. A processing system comprising:
a backplane bus having a plurality of slots each for connecting a circuit module to the processing system, each slot including a plurality of half-connectors and each having a binary signal thereon for uniquely identifying the slot; and a plurality of circuit modules connected to at least some of the plurality of slots, each module connected to any one of the plurality of slots and each module having
a plurality of half-connectors connected to the plurality of half-connectors of the slot to which the module is connected,
a digital-to-analog converter having an input port connected to the half-connectors of the module and having an output port;
heating means connected to the output port of the digital-to-analog converter,
an oscillator,
a thermally-responsive crystal, substantially identical to the crystals of the other modules of the plurality of modules, driving the oscillator and mounted in physical proximity to the heating means, and
a casing encapsulating the crystal and the heating means.

18. A circuit package arrangement for reducing additive emissions of signals of the same frequency radiated from a plurality of circuit packages each capable of having virtually identical frequency generating means for producing output signals of said same frequency, said arrangement comprising:

a communication bus including a plurality of circuit package connectors for connecting a plurality of circuit packages to said bus;
each individual one of said connectors having means cooperating with said bus for supplying coded signals uniquely defining an identity of said individual one of said connectors; and
one of said plurality of circuit packages connectable to different ones of said plurality of connectors for communication over said bus and being individually responsive to the coded signals from each individual one of said different ones of said connectors for generating output signals having a unique frequency for each individual one of said different ones of said connectors.

19. The arrangement of claim 18 wherein each of said plurality of circuit packages having
an oscillator operable at a same frequency, and
means individually responsive to the coded signals from each individual one of said different ones of said connectors for operating said oscillator for each of said connectors at a different frequency from others of said connectors.

20. The arrangement of claim 18 wherein
each connector comprises a plurality of terminals for connecting one of said plurality of circuit packages to said bus; and wherein said means for supplying coded signals comprise means for connecting together selected terminals of said plurality of connectors thereby to define a unique identification code for each connector.

21. The arrangement of claim 20 wherein said means for connecting together terminals comprise at least one of a plurality of conductors each applying selected signals to connected terminals to derive said cooled signals.

22. The arrangement of claim 21 wherein said conductors comprise a pair of conductors each carrying a different electrical potential.

23. The arrangement of claim 18 wherein said arrangement is a processing system, and wherein
   said circuit package comprises:
   a thermally-responsive crystal for generating a frequency that is a function of its temperature; and
   means responsive to the coded signals from each individual one of said different ones of said connectors for changing the temperature of the crystal as a function of the identity of the location to which the circuit package is connected.

24. A computer circuit package for reducing additive emissions of signals of the same frequency radiated from a plurality of circuit packages including said computer circuit package each capable of having virtually identical frequency generating means for producing output signals of said same frequency in a computer having
   at least one central processing unit,
   bus means having a plurality of circuit package connectors each for connecting said circuit package to said processing unit, and
   each individual one of said connectors having means cooperating with said bus for supplying coded signals uniquely defining an identity of said individual one of said connectors,
   said said computer circuit package being connectable to different ones of said plurality of connectors for communication over said bus with said central processing unit and being individually responsive to the coded signals from each individual one of said different ones of said connectors for generating output signals having a unique frequency for each individual one of said different ones of said connectors.

25. The package of claim 24 for a computer wherein said plurality of connectors are for connecting a plurality of circuit packages including said computer package to said processing unit, each circuit package comprising:
   an oscillator operable at a same frequency as oscillators of others of said circuit packages; and
   means individually responsive to the coded signals from each individual one of said different ones of said connectors for operating said oscillator for each of said connectors at a different frequency from others of said connectors.

26. The circuit package of claim 24 for reducing additive emissions of signals in a computer that is a processing system, wherein
   said circuit package comprises:
   a thermally-responsive crystal for generating a frequency that is a function of its temperature; and
   means responsive to the coded signals from each individual one of said different ones of said connectors for changing the temperature of the crystal as a function of the identity of the location to which the circuit package is connected.

* * * * *